United States Patent
Anderson et al.

(10) Patent No.: US 9,407,282 B2
(45) Date of Patent: Aug. 2, 2016

(54) ANALOG-TO-DIGITAL CONVERTER

(71) Applicant: Telefonaktiebolaget L M Ericsson (publ), Stockholm (SE)

(72) Inventors: Martin Anderson, Löddeköpinge (SE); Lars Sundström, Södra Sandby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/357,786

(22) PCT Filed: Oct. 11, 2012

(86) PCT No.: PCT/SE2012/000155
§ 371 (c)(1),
(2) Date: May 13, 2014

(87) PCT Pub. No.: WO2013/074010
PCT Pub. Date: May 23, 2013

(65) Prior Publication Data
US 2015/0065198 A1    Mar. 5, 2015

Related U.S. Application Data

(60) Provisional application No. 61/560,954, filed on Nov. 17, 2011.

(30) Foreign Application Priority Data

Nov. 14, 2011 (EP) .................................... 11189057

(51) Int. Cl.
*H04B 1/38* (2015.01)
*H03M 3/00* (2006.01)
(Continued)

(52) U.S. Cl.
CPC .............. *H03M 3/396* (2013.01); *H03M 3/374* (2013.01); *H03M 3/436* (2013.01); *H03M 3/458* (2013.01);
(Continued)

(58) Field of Classification Search
CPC ....................................................... H03M 3/458

USPC .................................. 455/561, 411; 341/143
See application file for complete search history.

(56) References Cited

U.S. PATENT DOCUMENTS 6,639,531 B1    10/2003    Melanson et al.
7,042,377 B2 *    5/2006    Oliaei ........................... 341/143
(Continued)

FOREIGN PATENT DOCUMENTS

WO    2006067382 A1    6/2006
WO    2008071791 A1    6/2008

OTHER PUBLICATIONS

U.S. Appl. No. 14/355,651.*
(Continued)

*Primary Examiner* — Sanh Phu
(74) *Attorney, Agent, or Firm* — Murphy, Bilak & Homiller, PLLC

(57) ABSTRACT

A continuous-time ΔΣ-ADC (1) is disclosed. It comprises a sampled quantizer (5) arranged to generate samples y(n) of a digital output signal of the ΔΣ-ADC (1) at sample instants nT, where n is an integer sequence index and T is a sampling period, based on an analog input signal to the quantizer (5). Furthermore, the ΔΣ-ADC (1) comprises one or more DACs (10*a-b*), each arranged to generate an analog feedback signal based on the samples of the digital output signal generated by the sampled quantizer (5). Moreover, the ΔΣ-ADC (1) comprises a continuous-time analog network (20) arranged to generate the analog input signal to the quantizer (5) based on the feedback signal(s) from the one or more DACs (10*a-b*) and an analog input signal to the ΔΣ-ADC (1). At least one DAC (10*b*) of the one or more DACs (10*b*) comprises two switched-capacitor DACs (40, 50) arranged to operate on the same input but with a mutual delay in time. A corresponding radio receiver circuit (100), a corresponding intergrated circuit (200), and a corresponding radio communication apparatus (300, 400) are also disclosed.

15 Claims, 6 Drawing Sheets

(51) Int. Cl.
*H04B 1/16* (2006.01)
*H04W 88/02* (2009.01)
*H04W 88/08* (2009.01)

(52) U.S. Cl.
CPC ............. *H03M 3/464* (2013.01); *H04B 1/16* (2013.01); *H04W 88/02* (2013.01); *H04W 88/08* (2013.01); *H03M 3/454* (2013.01)

(56) References Cited

U.S. PATENT DOCUMENTS

| | | | |
|---|---|---|---|
| 7,242,336 B1 | 7/2007 | Jensen | |
| RE41,518 E | 8/2010 | Xu | |
| 8,060,058 B2* | 11/2011 | Ch'ng et al. | 455/411 |
| 8,344,921 B2* | 1/2013 | Lin et al. | 341/143 |
| 8,595,157 B2 | 11/2013 | Cruz-Albrecht et al. | |
| 2008/0100486 A1 | 5/2008 | Lin et al. | |
| 2008/0143570 A1* | 6/2008 | Andersson et al. | 341/144 |
| 2010/0117723 A1 | 5/2010 | Choi et al. | |
| 2013/0044018 A1 | 2/2013 | Kinyua et al. | |
| 2013/0088376 A1 | 4/2013 | Lin et al. | |
| 2015/0065198 A1 | 3/2015 | Anderson et al. | |

OTHER PUBLICATIONS

Anderson, Martin et al., "A 312-MHz CT DeltaSigma Modulator Using a SC Feedback DAC with Reduced Peak Current", 33rd European Solid State Circuits Conference, 2007. ESSCIRC 2007. Sep. 11-13, 2007. pp. 240-243. Munich, Germany.

De La Rosa, José, "Sigma-Delta Modulators: Tutorial Overview, Design Guide, and State-of-the-Art Survey", IEEE Transactions on Circuits and Systems-I: Regular Papers. Jan. 2011. pp. 1-21. vol. 58. No. 1.

Jo, Jun-Gi et al., "A 20-MHz Bandwidth Continuous-Time Sigma-Delta Modulator with Jitter Immunity Full Clock Period SCR (FSCR) DAC and High Speed DWA", IEEE Journal Of Solid-State Circuits. Nov. 11, 2011. pp. 2469-2477. vol. 46. No. 11.

Ortmanns, Maurits et al., "A Continuous-Time SigmaDelta Modulator with Reduced Sensitivity to Clock Jitter Through SCR Feedback", IEEE Transactions on Circuits and Systems-I: Regular Papers. May 2005. pp. 875-884. vol. 52. No. 5.

Shouli, Yan et al., "A Continuous-Time SigmaDelta Modulator with 88-dB Dynamic Range and 1.1-MHz Signal Bandwidth", IEEE Journal of Solid-State Circuits. Jan. 2004. pp. 75-86. vol. 39. No. 1.

Breems, Lucien J. et al., "A 56 mW Continuous-Time Quadrature Cascaded DeltaSigma Modulator With 77 dB DR in a Near Zero-IF 20 MHz Band", IEEE Journal of Solid-State Circuits, vol. 42, No. 12, Dec. 2007, 2696-2704.

Jiang, Yang et al., "A Fixed-Pulse Shape Feedback Technique with Reduced Clock-Jitter Sensitivity in Continuous-Time Sigma-Delta Modulators", IEEE International Conference on Electronics, Circuits, and Systems, Dec. 12, 2010, 547-550.

Radjen, Dejan et al., "A Continuous Time DeltaSigma Modulator with Reduced Clock Jitter Sensitivity through DSCR Feedback", IEEE 2011, Nov. 14, 2011, 1-4.

\* cited by examiner

ANALOG-TO-DIGITAL CONVERTER

TECHNICAL FIELD

The present invention relates to the field of analog-to-digital converters, in particular to the field of continuous-time delta-sigma analog-to-digital converters.

BACKGROUND

FIG. 1 shows a general depiction of a continuous-time delta sigma (ΔΣ) analog-to-digital converter (ADC). The conventional ΔΣ ADC converts an analog input signal u into a high-frequency serial bit sequence having a low resolution, often only 1 bit (0 or 1), here called $v_d$. This coarsely quantized bit sequence $v_d$ is converted into a highly accurate digital signal w with a lower sampling rate through subsequent digital low pass decimation filters, $H_d$. This is possible since the energy of the quantization noise is distributed at frequencies outside the frequency band of interest.

The ΔΣ ADC of FIG. 1 comprises a coarse quantizer, a loop filter and a feedback DAC. The coarse quantizer comprises one or more comparators clocked at a clock rate a lot higher than the bandwidth of the analog input signal u. The digital-to-analog converter (DAC) provided in the feedback branch generates from the digital output signal of the quantizer, $v_d$, a sequence of quantized analog signals here called the feedback signal, $v_a$. The loop filter processes both the analog input signal u and the quantization errors, ε, injected into the system in the coarse quantizer. By selecting the transfer function of the loop filter, $L_u$ and $L_v$, in such a way that, in the band of interest, the transfer function for the quantization errors c is many times smaller than the transfer function for the analog input signal u, the signal-to-quantization "noise" ratio (SQNR) in that particular frequency band can be made large.

Thus, by selecting $L_v$ properly, the noise transfer function (NTF) can be made high-pass or band-pass:

$$NTF = \frac{v_d}{\varepsilon} = \frac{1}{1 - L_v} \quad (1)$$

whereas the signal transfer function (STF) is a function of both $L_u$ and $L_v$:

$$STF = \frac{v_d}{u} = \frac{L_u}{1 - L_v} \quad (2)$$

The loop filter can be implemented using active discrete time (DT) filters or active continuous time (CT) filters or even passive loop filters. If the NTF is selected having zeros at low frequencies (DC), the loop filter will be built up of integrators, which can be implemented using negative feedback amplifiers. The reason for using CT filters above their DT counterparts is that they provide anti-alias filtering, have no front-end sampling, no kT/C noise and theoretical speed advantages which lead to a lower power consumption at a given analog signal bandwidth.

Prior art in the implementation of the feedback DAC in CT modulators is to use a switched current (SI), or a switched capacitor (SC) to inject a well defined amount of charge to the summing node of the integrator.

FIG. 2 shows a possible implementation of a 1-bit SI feedback according to prior art. A logically high data bit of the digital output signal (HIGH), $v_d$, is applied as a corresponding reference voltage (for example $V_{REF+}=1$ volt) to the inverting signal input of the amplifier, and a logically low signal (LOW) of the digital output signal is fed back as a second reference voltage (for example $V_{REF-}=-1$ volt). The reference voltage is converted to a reference current through the resistor between the $V_{REF}$ node and the virtual ground (summing node) at the amplifier input.

In the SC feedback according to prior art (e.g. FIG. 3) a capacitor $C_{REF}$, is switched using a set of switches between the reference voltage $V_{REF}$ and to the inverting input of the operational amplifier. A reference resistance $R_{REF}$ might be connected on either side of the capacitor to control the time constant of the switching RC circuit. The reference capacitor is charged with the reference voltage ($V_{REF+}$ or $V_{REF-}$) corresponding to the digital output bit in a first clock phase, and then transfers a well defined charge packet $Q=C*V_{REF}$ to the integrator in a second clock phase when the switch circuit switches the reference capacitor $C_{REF}$ to the inverting input of the amplifier. The discharge of the capacitor $C_{REF}$ will give an exponentially falling current pulse τ
$I=I_0*\exp(-t/\tau)$ where $\tau=R_{REF}*C_{REF}$ is the time constant. Because of the exponentially decreasing pulse shape the charge Q displaced in one clock cycle T varies only slightly when clock jitter occurs, and thus this technique is less sensitive to clock jitter than the ΔΣ ADCs illustrated in FIG. 2.

SUMMARY

In accordance with embodiments of the present invention, the inventors have provided for the design of continuous-time ΔΣ ADCs using SC feedback with relatively low current consumption.

According to a first aspect, there is provided a continuous-time ΔΣ-ADC. The continuous-time ΔΣ-ADC comprises a sampled quantizer arranged to generate samples y(n) of a digital output signal of the ΔΣ-ADC at sample instants nT, where n is an integer sequence index and T is a sampling period, based on an analog input signal to the quantizer. Furthermore, the continuous-time ΔΣ-ADC comprises one or more digital-to-analog converters (DACs), each arranged to generate an analog feedback signal based on the samples of the digital output signal generated by the sampled quantizer. Moreover, the continuous-time ΔΣ-ADC comprises a continuous-time analog network arranged to generate the analog input signal to the quantizer based on the feedback signal(s) from the one or more DACs and an analog input signal to the ΔΣ-ADC. At least one DAC of the one or more DACs comprises two switched-capacitor DACs (as subcomponents) arranged to operate on the same input but with a mutual delay in time.

Each of the two switched capacitor DACs may be arranged to, for each n, be charged with a charge proportional to the sample y(n) of the digital output signal. Furthermore, a first of the switched capacitor DACs may be arranged to (again, for each n) be switched in to the continuous-time analog network for transfer of its charge to the continuous-time analog network in a time interval that lasts between the time instants $(n+\alpha3)T$ and $(n+\beta3)T$. Moreover, a second of the switched capacitor DACs may be arranged to (again, for each n) be switched in to the continuous-time analog network for transfer of its charge to the continuous-time analog network in a time interval that lasts between the time instants $(n+\alpha4)T$ and $(n+\beta4)T$. The following relations may apply: $\beta4>1$, $0<\alpha3<\alpha4<\beta4<2$ and $\alpha3<\beta3\leq1$.

According to some embodiments, $\alpha4\leq\beta3$.

According to some embodiments, $\alpha4=\beta3$. For example, in some embodiments, $\alpha4=\beta3=1$, $\alpha3=0.5$, and $\beta4=1.5$.

Said one or more DACs may comprises one or more additional DACs, in addition to the at least one DAC comprising the two switched capacitor DACs. In other words, said one or more DACs may actually be two or more DACs. At least a first DAC of the one or more additional DACs may be adapted to generate a pulsed feedback signal that, for each n, comprises a pulse, the magnitude of which is proportional to the sample of the digital output signal at sample instant nT and which lasts between the time instants $(n+\alpha 1)T$ and $(n+\beta 1)T$, wherein $0<\alpha 1<\beta 1<1$. Said first DAC may be located in a first feedback loop and the DAC comprising the two switched-capacitor DACs may located in a second feedback loop, which may be an outer feedback loop relative to the first feedback loop (i.e. a loop that has a higher order of integration than the first feedback loop).

The continuous-time analog network may comprise a plurality of cascaded continuous-time integrators. A first one of the integrators may be arranged to receive a feedback signal from one of the DACs, connected to the first integrator, and the analog input signal of the $\Delta\Sigma$-ADC as input signals. Each of the other integrators may be arranged to receive a feedback signal from one of the DACs, connected to that integrator, and an output signal of a preceding integrator as input signals.

A last one of the cascaded continuous-time integrators may be arranged to generate the analog input signal to the sampled quantizer.

The continuous-time $\Delta\Sigma$-ADC may further comprise a memoryless feedback path from the output of the sampled quantizer to the input of the sampled quantizer.

According to a second aspect, there is provided a radio receiver circuit comprising the continuous-time $\Delta\Sigma$-ADC according to the first aspect.

According to a third aspect, there is provided an integrated circuit comprising the continuous-time $\Delta\Sigma$-ADC according to the first aspect.

According to a fourth aspect, there is provided a radio communication apparatus comprising the continuous-time $\Delta\Sigma$-ADC according to the first aspect, the radio receiver circuit according to the second aspect, and/or the integrated circuit according to the third aspect.

The radio communication apparatus may e.g. be, but is not limited to, a mobile phone, a wireless data modem, or a radio base station.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

The inventors have realized that a DAC, which is used for feedback in a continuous-time delta-sigma ($\Delta\Sigma$) analog-to-digital converter (ADC), can be advantageously implemented using two switched capacitor DACs (as subcomponents) that share a common output and operate on the same input but with a mutual delay in time. Hence, the two switched-capacitor DACs (subcomponents) are thus arranged to together act as a single combined DAC, which is different from e.g. two switched-capacitor DACs that have separate individual outputs and/or are arranged to operate on different inputs. Such DACs are described below e.g. in the context of FIGS. 8-10. However, to simplify the understanding and to put these descriptions in a context, embodiments of a particular type of continuous-time $\Delta\Sigma$-ADC, developed by the inventors and for which such DACs are well suited, are first described. It should be remembered, though, that the DAC, comprising two switched capacitor DACs as subcomponents, may well be used in other types of continuous-time $\Delta\Sigma$-ADCs as well.

Figure 4:
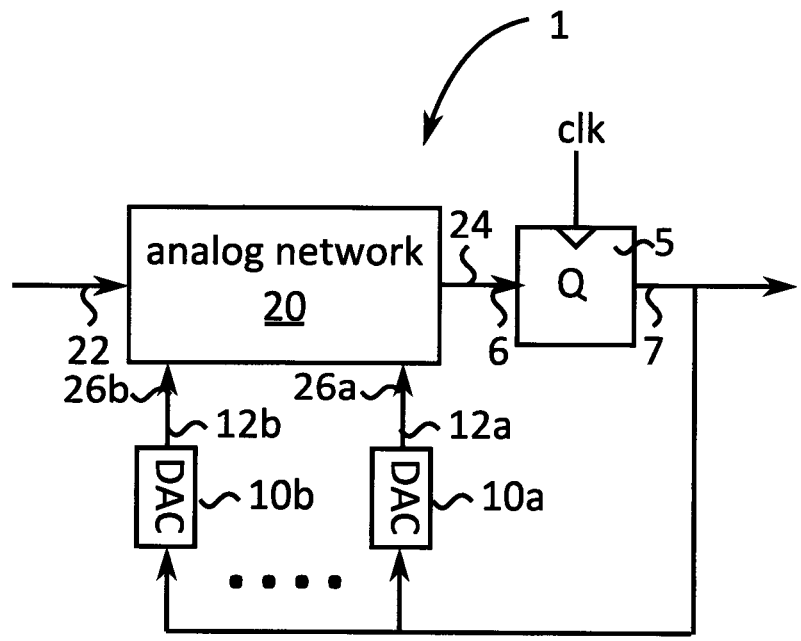
FIG. 4 illustrates a continuous-time $\Delta\Sigma$-ADC according to embodiments of the present invention.

FIG. 4 is a simplified block diagram of a continuous-time $\Delta\Sigma$-ADC 1 according to embodiments of the present invention. The $\Delta\Sigma$-ADC 1 comprises a sampled quantizer 5. The sampled quantizer 5 is arranged to receive an analog input signal of the sampled quantizer 5 on an input terminal 6. The sampled quantizer 5 is arranged to generate samples of a digital output signal of the $\Delta\Sigma$-ADC 1 at sample instants nT (where n is an integer sequence index and T is a sampling period of the clock signal clk), based on the analog input signal to the quantizer 5. The sample of the digital output signal at the sample instant nT is in the following denoted y(n). The digital output signal is generated on an output port 7 of the sampled quantizer 5. The sampled quantizer 5 may be a single-bit or a multibit quantizer.

Figure 2:
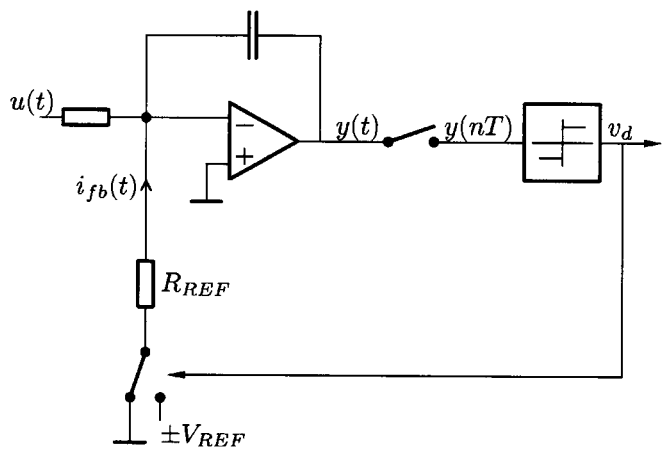
Figure 3:
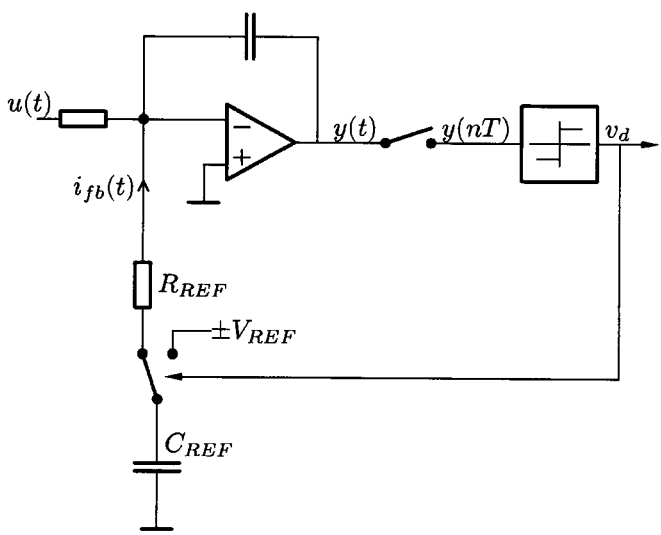

In addition, the $\Delta\Sigma$-ADC 1 comprises two or more digital-to-analog converters (DACs) 10a-b, each arranged to generate an analog feedback signal based on the samples of the digital output signal generated by the sampled quantizer 5 on output terminals 12a-b. Each of said two or more DACs may e.g. be of switched-current (e.g. similar to the SI feedback discussed with reference to FIG. 2) or switched-capacitor (e.g. similar to the SI feedback discussed with reference to FIG. 3) type. One (or more) of them is of the type mentioned above, including two switched-capacitor DACs as subcomponents. Furthermore, the $\Delta\Sigma$-ADC 1 comprises a continuous-time analog network 20. The continuous-time analog network 20 has an input terminal 26a-b for each of the two or more DACs 10a-b for receiving the feedback signals generated by the DACs 10a-b. The continuous-time analog network is arranged to generate the analog input signal to the quantizer 5, on an output terminal 24 of the continuous-time analog network 20, based on the feedback signals from the two or more DACs 10a-b and an analog input signal to the $\Delta\Sigma$-ADC 1, received on an input terminal 22 of the continuous-time analog network 20.

Figure 5:
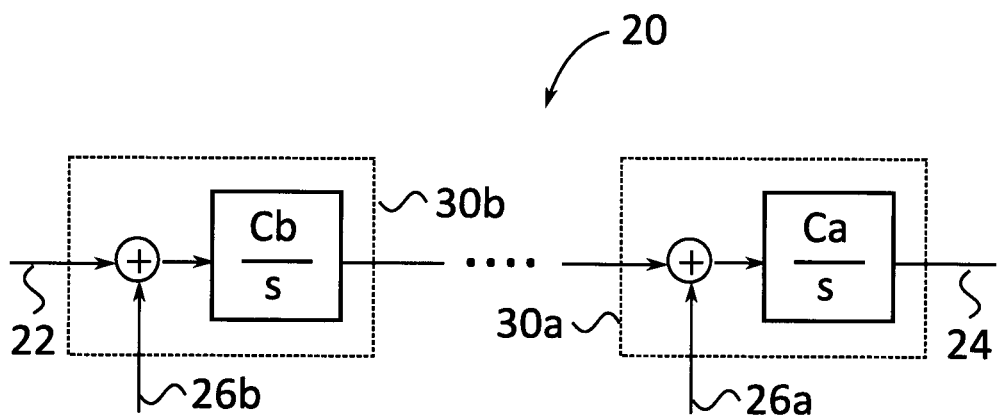
FIG. 5 illustrates a continuous-time analog network according to embodiments of the present invention.

An example of how the continuous-time analog network 20 may be embodied is illustrated in FIG. 5. As illustrated in FIG. 5, the continuous-time analog network 20 may comprise a plurality of cascaded continuous-time integrators 30a-b. A first one of the integrators (in FIG. 5, the integrator 30b) may be arranged to receive a feedback signal from one of the DACs connected to the first integrator 30b, and the analog input signal of the $\Delta\Sigma$-ADC 1 as input signals. Furthermore, as illustrated in FIG. 5, each of the other integrators may be arranged to receive a feedback signal from one of the DACs, connected to that integrator, and the output signal of a preceding integrator as input signals. Moreover, as illustrated in FIG. 5, a last one of the cascaded continuous-time integrators (in FIG. 5, the integrator 30a) may be arranged to generate the analog input signal to the sampled quantizer 5. The integrators may e.g. be implemented as active RC integrators or Gm-C integrators. The design of such integrators with multiple inputs is well known and therefore not further described herein.

Figure 6:
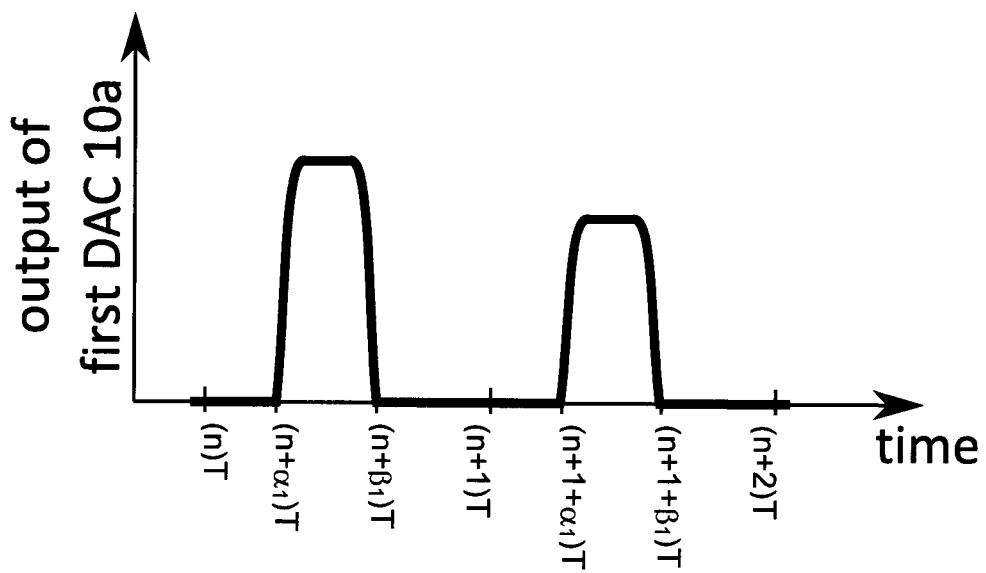
FIGS. 6-7 illustrate examples of pulse waveforms.

According to embodiments of the present invention, at least a first DAC (e.g. 10a, which is the reference sign used for the first DAC in the following) of the two or more DACs 10a-b is adapted to generate a pulsed feedback signal that, for each n, comprises a pulse (e.g. output electrical current pulse), the magnitude of which is proportional to the sample of the digital output signal at sample instant nT and which lasts between the time instants $(n+\alpha 1)T$ and $(n+\beta 1)T$, wherein $0<\alpha 1<\beta 1<1$. This is schematically illustrated in FIG. 6 with a waveform diagram.

Figure 7:
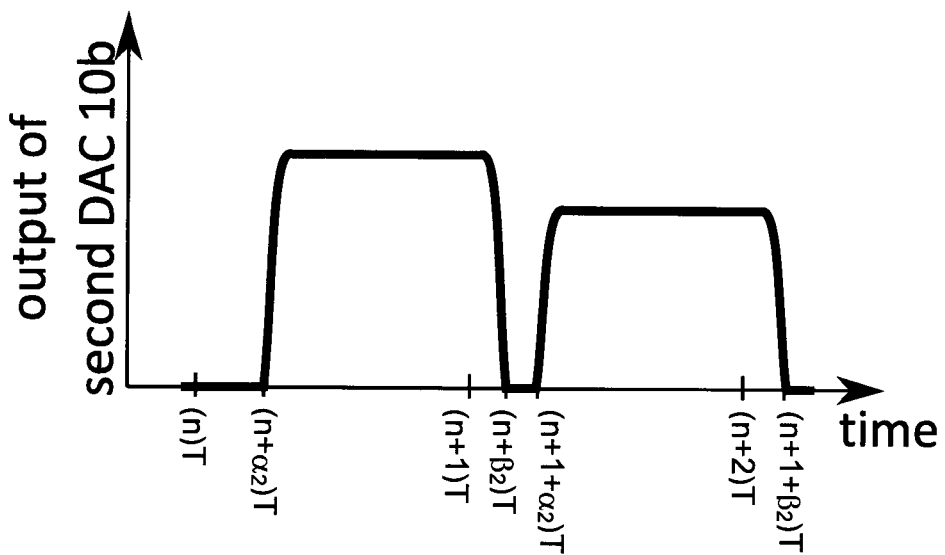

According to embodiments of the present invention, at least a second DAC (e.g. 10b, which is the reference sign used for the second DAC in the following) of the two or more DACs 10a-b is adapted to generate a pulsed feedback signal that, for each n, comprises a pulse, the magnitude of which is proportional to the sample of the digital output signal at sample instant nT and which lasts between the time instants $(n+\alpha 2)T$ and $(n+\beta 2)T$, wherein $0<\alpha 2<1<\beta 2$. This is schematically illustrated in FIG. 7 with a waveform diagram.

The inventors have realized that the inner loop or loops (loops with relatively low order of integration) of continuous-time $\Delta\Sigma$-ADC contributes more to the sensitivity to excess loop delay of the $\Delta\Sigma$-ADC, because their impact on the impulse response of the cascade of feedback DAC and loop filter is the largest, and therefore changes the loop gain of the system the most. The inventors have realized that using a DAC such as the aforementioned first DAC 10a in such inner loop(s) alleviates this problem, since the impulse response of the cascade of feedback DAC and loop filter is less sensitive to a delay of such a feedback pulse. Thereby, the loop gain is affected less, making the closed loop performance of the $\Delta\Sigma$-ADC more robust to such delays. In some embodiments, a memoryless feedback path may be included, i.e. with one DAC whose output contributes directly (i.e. without integration) to the analog input signal of the sampled quantizer. Referring to FIG. 5, the output of such a DAC would thus be added to the output of the integrator 30a for forming the analog input signal to the sampled quantizer 5. Such a memoryless path can provide a further reduced sensitivity to loop delay. In some embodiments, further feedback or feedforward paths may also be provided between internal nodes of the continuous-time analog network 20.

In addition, the inventors have realized that the outer loop or loops (loops with relatively high order of integration) of continuous-time $\Delta\Sigma$-ADC may be sensitive to clock jitter and thermal noise since such errors from the outermost loops have less noise shaping than the inner loops when referred to the output of the $\Delta\Sigma$-ADC. The inventors have realized that using a DAC such as the aforementioned second DAC 10b in such outer loop(s) alleviates this problem, since they feed back the lowest average current and thereby gives the optimum thermal noise performance and clock jitter sensitivity. In combination, these measures provide reduced requirements on the gain bandwidth of the integrating amplifiers of the innermost loop and the best noise performance of the outermost loop. The present invention therefore facilitates increased sampling rates giving either increased bandwidth or dynamic range of the $\Delta\Sigma$-ADC at a low cost. Alternatively, the reduced sensitivity to loop delay can be utilized to reduce the power consumption by reducing the excess bandwidth of the integrating amplifiers commonly introduced to guarantee stability in presence of process variations and mismatch.

Accordingly, in some embodiments of the present invention, the first DAC 10a is located in a first feedback loop and the second DAC 10b is located in a second feedback loop, which is an outer feedback loop relative to the first feedback loop (i.e., which has a higher order of integration than the first feedback loop). For example, the first loop may be the innermost loop, i.e. a loop with first order integration. Furthermore, the second loop may be the outermost loop, i.e. the loop with the highest order integration.

Even though the timing of the feedback pulses can be chosen arbitrary in principal there are practical restrictions coming from the time required to avoid quantizer metastability, and the complexity of the clocking scheme.

The decision time of the quantizer requires us to choose the start point of all feedback pulses significantly after the quantizer sampling instant nT ($nT<<(n+\alpha_k)T$ for all k, for example $\alpha_k>0.1$). The exact timing depends on the clocking scheme. For a two phase (0, 180 degree) clocking scheme, a natural starting point (i.e. $(n+\alpha k)T$) is $(n+0.5)T$, while if a four phase clocking scheme is available, $(n+0.25)T$ may be chosen, and eight phases would facilitate a starting point of $(n+0.125)T$.

While the inventors have not found any particular advantage of having different starting points for different feedback pulses, the selection of the endpoint on the other hand, has been found to influence the sensitivity to clock jitter and loop delay, as well as the thermal noise performance of the DAC. It yields the best noise performance to maximize the relative feedback pulse duration ($\beta-\alpha$). Therefore, according to some embodiments, in the outermost loops, which contribute a lot to the overall noise performance of the $\Delta\Sigma$-ADC, $(\beta-\alpha)=1$ is chosen. Thus, depending on the available clock scheme, natural end points for the outermost loops would be $(n+\beta 2)T=(n+1+0.5)T$, $(n+1+0.25)T$ or $(n+1+0.125)T$. The inventors have further found that the sensitivity to loop delay is reduced if the innermost DAC pulse end point is significantly earlier than the succeeding quantizer sampling instant, i.e. $\beta_1<<1$, for example $\beta_1<0.9$. A convenient choice for most RZ (return to zero) clocking schemes is to have 50% duty cycle for the innermost feedback pulses, resulting in end points of $(n+\beta 1)T=(n+0.5+0.5)T$, $(n+0.5+0.25)T$ or $(n+0.5+0.125)T$, depending on the clock scheme. An important remark here is of course that $(n+0.5+0.5)T$ equals the timing of the succeeding sampling instant and therefore yields no improved sensitivity to loop delay.

Alternatively, when any clocking scheme is used, arbitrary starting points may be accomplished by using delay elements, such as an inverter or a plurality of cascaded inverters (depending on what delay is desired) to generate delayed clock pulses of other delays than those naturally provided by the clock phases of a particular clocking scheme (e.g. four-phase or eight phase). However, such a delay would have to be relatively exact, or well defined, in order not to change the transfer function of the loop, and it is typically easier to get a high precision in the clock delay by using the already well defined clock phases naturally provided by the particular clocking scheme.

Figure 8:
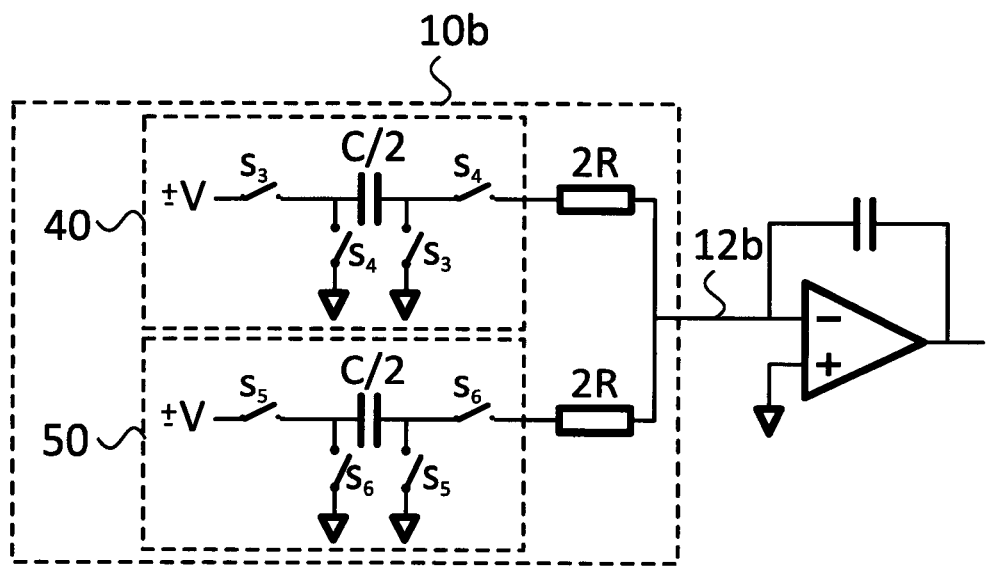
FIGS. 8-9 illustrate digital-to-analog converters (DACs) according to embodiments of the present invention.
Figure 9:
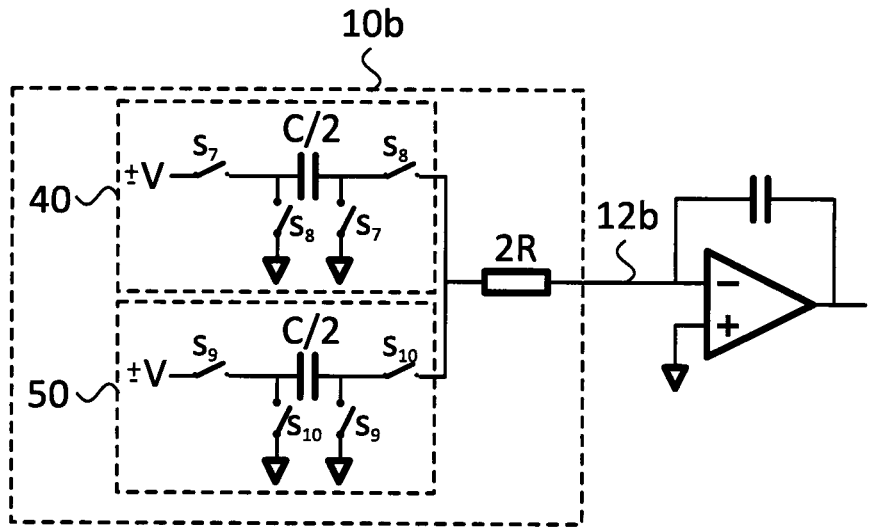

According to embodiments of the present invention, at least one DAC of the two or more DACs 10a-b comprises two switched-capacitor (SC) DACs (as sub components). Embodiments of such DACs are illustrated in FIGS. 8-9. In FIGS. 8-9, a first one of the SC DACs is labeled 40 and a second one of the SC DACs is labeled 50. For each n, each of the two switched capacitor DACs 40 and 50 is arranged to be charged with a charge proportional to the corresponding sample y(n) of the digital output signal. The first SC DAC 40 is arranged to be switched in to the continuous-time analog network 20 for transfer of its charge to the continuous-time analog network 20 in a time interval that lasts between the time instants $(n+\alpha 3)T$ and $(n+\beta 3)T$. Furthermore, the second SC DAC 50 is arranged to be switched in to the continuous-time analog network 20 for transfer of its charge to the continuous-time analog network 20 in a time interval that lasts between the time instants $(n+\alpha 4)T$ and $(n+\beta 4)T$. These parameters are related such that $\beta 4>1$, $0<\alpha 3<\alpha 4<\beta 4<2$ and $\alpha 3<\beta 3<1$. This is schematically illustrated with a waveform diagram in FIG. 10, further discussed below.

According to some embodiments, the aforementioned DAC comprising the two SC DACs (as subcomponents) is the second DAC 10b (in which case $\alpha 3=\alpha 2$ and $(\beta 4=\beta 2)$, as is also indicated with reference signs 10b used in FIGS. 8-9. However, this use of reference signs should not be seen as limiting. Additionally or alternatively, in other embodiments, one or more other DACs may be implemented using two SC DACs (as subcomponents).

In some embodiments, the DAC comprising the two SC DACs is located in a feedback loop, which is an outer feedback loop (i.e. a feedback loop of higher order) relative to the first feedback loop.

Figure 1:
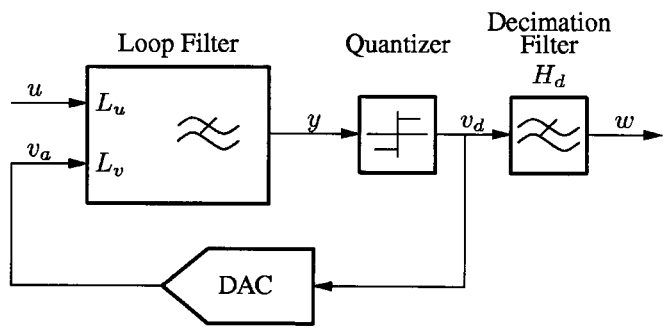
FIGS. 1-3 illustrate general continuous-time $\Delta\Sigma$-ADCs.

In the SC feedback according to FIG. 1 discussed in the background, a capacitor $C_{REF}$, is switched using a set of switches between the reference voltage $V_{REF}$ and to the inverting input of the operational amplifier. A reference resistance $R_{REF}$ might be connected on either side of the capacitor to lower the time constant of the switching RC circuit. The reference capacitor is charged with the reference voltage ($V_{REF+}$ or $V_{REF-}$) corresponding to the digital output bit (single-bit quantization is assumed) in a first clock phase, and then transfers a well defined charge packet $Q=C^*V_{REF}$ to the integrator in a second clock phase when the switch circuit switches the reference capacitor $C_{REF}$ to the inverting input of the amplifier. The discharge of the capacitor $C_{REF}$ will give an exponentially falling current pulse $\tau$
$I=I_0^*\exp(-t/\tau)$ where $\tau=R_{REF}^*C_{REF}$ is the time constant. Because of the exponentially decreasing pulse shape the charge Q displaced in one clock cycle T varies only slightly when clock jitter occurs, and thus this technique is less sensitive to clock jitter than the $\Delta\Sigma$ ADCs illustrated in FIGS. 1-2. Furthermore, an advantage of using two switched capacitor DACs with mutually displaced output pulses has the advantage, compared with a single switched-capacitor DAC, that the peak current is reduced, whereby the risk of slewrate limitations in the continuous-time analog network 20 is reduced. This can e.g. be exploited by implementing the continuous-time analog network 20 using components with less harsh slewrate requirements, which in turn enables a reduced current consumption.

FIG. 8 shows a 1-bit version of the DAC comprising the two SC DACs 40-50 according to an embodiment. Each SC DAC 40 and 50 comprises a capacitor and a set of switches as depicted in FIG. 8. Switches of the SC DACs 40 and 50 are controlled by non-overlapping switch phases s3-s4 and s5-s6, respectively. Below, the output bit of the quantizer 5 is assumed to be 1. If it is 0, then V shall be replaced by −V in the following discussion. When s3 is on (conducting) the first of the switched capacitor DACs 40 is charging to $Q=V^*C/2$. When s4 is on the first of the switched capacitor DACs 40 is discharging into the analog network 20. For proper operation s3 and s4 should not be on at the same time. When s5 is on the second of the switched capacitor DACs 50 is charging to $Q=V^*C/2$. When s6 is on the second of the switched capacitor DACs 50 is discharging into the analog network 20. For proper operation s5 and s6 should not be on at the same time.

A resistor (with resistance 2R) is connected in series with each one of the switched capacitors to control the time constant (RC) of its discharge and the peak of the output current $I=V/(2R)$. In FIG. 9, the two SC DACs 40 and 50 are implemented as in FIG. 8. However, in FIG. 9, a shared resistor (with resistance 2R) is used for the two SC DACs 40 and 50.

For someone skilled in the art it is straightforward to extend the 1-bit switched capacitor DACs shown in FIGS. 8 and 9 into multi-bit switched capacitor DACs by using e.g. binary weighted or thermometer coded switched capacitor banks controlled in the same way (for embodiments where the quantizer 5 is a multibit quantizer).

Figure 10:
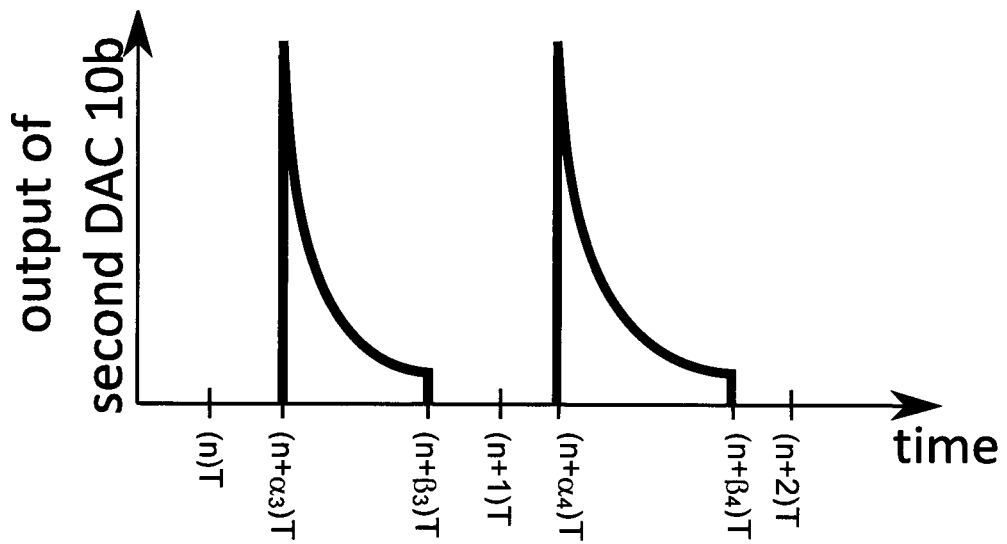
FIG. 10 illustrates an example of pulse waveforms.

The first 40 and the second 50 SC DAC together generate an overall DAC impulse response as exemplified in FIG. 10. Generally, the two discharge time intervals of the first 40 and second 50 of the switched capacitor DACs can be chosen arbitrary. In FIG. 10, they have been illustrated for $\beta 3<\alpha 4$ for ease of illustration. However, in other embodiments these parameters may be such that $\beta 3>\alpha 4$ or ($\beta 3=\alpha 4$ as well. The inventors have found that having $\beta 3=\alpha 4$ typically yields the best or close to the best implementation in practice. Also, it seems practical to have the same capacitor size in the first 40 and the second 50 of the switched capacitor DACs (letting them carry half of the charge from each of the sampling instants nT each), as shown in FIG. 8 and FIG. 9, even though any other ratio between the capacitor sizes could be used in principal. Having equal capacitor size also gives the same discharge time constants for the two segments of the impulse response.

Using a two-phase (0 and 180 degrees) clock scheme can yield the following timing of the feedback pulses: $\alpha 3=0.5$, $\beta 3=\alpha 4=1$, and $\beta 4=1.5$. Since the charging of the switched capacitor DACs will take place from $(n-1+\beta 3)T$ to $(n+\alpha 3)T$ and $(n-1+\beta 4)T$ to $(n+\alpha 4)T$ the first of the switched capacitor DACs 40 will charge with a charge proportional to the sample of the digital output signal at sample instant nT in the same time interval as the second of the switched capacitor DACs 50 is discharging its charge proportional to the sample of the digital output signal at the preceding sample instant $(n-1)T$.

Using a four-phase (0, 90, 180, and 270 degrees) clock scheme could e.g. yield the following timing of the feedback pulses: $\alpha 3=0.25$, $\beta 3=\alpha 4=1$, and $\beta 4=1.75$. Since the sum of the discharge time intervals of the first and second of the switched capacitor DACs 40 is greater than the sampling interval T, there will be some overlap between the discharge time intervals of the first and second of the switched capacitor DACs 50, in this case from $(n+0.25)T$ to $(n+0.75)T$, for all n.

When the discharge time intervals of the first and second of the switched capacitor DACs is not overlapping, as is the case for the two-phase clock scheme above, the series resistor can be shared between the first 40 and second 50 of the switched capacitor DACs, as shown in FIG. 9.

Figure 11:
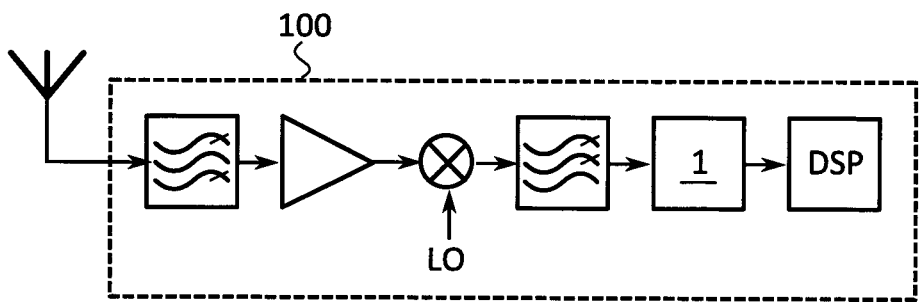
FIG. 11 schematically illustrates a radio receiver circuit.

According to some embodiments, a radio receiver circuit comprises the continuous-time $\Delta\Sigma$-ADC 1. This is schematically illustrated in FIG. 11, where the continuous-time $\Delta\Sigma$-ADC 1 is placed in a radio receiver circuit 100 in between the analog signal processing domain domain (circuits to the left of the $\Delta\Sigma$-ADC 1) and the digital signal processing domain (block marked DSP).

Figure 12:
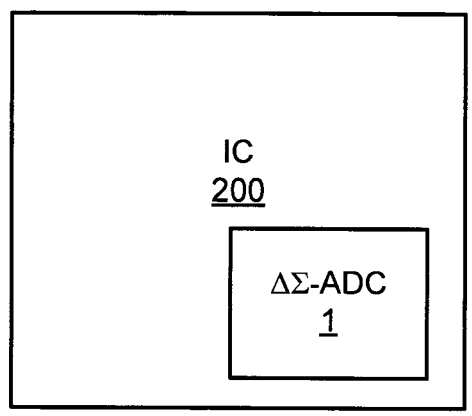
FIG. 12 schematically illustrates an integrated circuit.

According to some embodiments, an integrated circuit comprises the continuous-time $\Delta\Sigma$-ADC 1. This is schematically illustrated in FIG. 12, where the continuous-time $\Delta\Sigma$-ADC 1 is placed in an integrated circuit (IC) 200.

In some embodiments, a radio communication apparatus comprises the continuous-time ΔΣ-ADC 1. For example, the radio communication apparatus may comprise a radio receiver circuit, such as the radio receiver circuit 100 and/or an integrated circuit, such as the integrated circuit 200, that in turn comprises the ΔΣ-ADC 1.

Figure 13:
FIG. 13 schematically illustrates a mobile phone in communication with a radio base station.

Non-limiting examples of such radio communication apparatuses are a mobile phone, a wireless data modem, and a radio base station. FIG. 13 schematically illustrates examples of radio communication apparatuses in the form of a mobile phone 300 and a radio base station 400 in communication with each other.

The present invention has been described above with reference to specific embodiments. However, other embodiments than the above described are possible within the scope of the invention. For example, as indicated in the beginning of this detailed description, the DAC comprising two SC DACs as subcomponents may be used in other types of continuous-time ΔΣ-ADCs than the continuous-time ΔΣ-ADC embodiments described above. For example, in some embodiments, the continuous-time ΔΣ-ADC may comprise only a single DAC (which in turn comprises two SC DACs, acting on the same input signal and having a common output, as sub components described). Furthermore, in addition to the types of DACs described, other types of DACs, e.g. using other pulse durations, may be used as well in some feedback loops of the ΔΣ-ADC. The different features of the embodiments may be combined in other combinations than those described. The scope of the invention is only limited by the appended patent claims.

The invention claimed is:

1. A continuous-time delta-sigma (ΔΣ) analog-to-digital converter (ADC), comprising:
   a sampled quantizer arranged to generate samples y(n) of a digital output signal of the ΔΣ-ADC at sample instants nT, where n is an integer sequence index and T is a sampling period, based on an analog input signal to the quantizer;
   one or more digital-to-analog converters (DACs), each arranged to generate an analog feedback signal based on the samples of the digital output signal generated by the sampled quantizer; and
   a continuous-time analog network arranged to generate the analog input signal to the quantizer based on the feedback signal(s) from the one or more DACs and an analog input signal to the ΔΣ-ADC; wherein
   at least one DAC of the one or more DACs comprises two switched-capacitor DACs arranged to operate on the same input but with a mutual delay in time.

2. The continuous-time ΔΣ-ADC of claim 1, wherein, for each n:
   each of the two switched capacitor DACs is arranged to be charged with a charge proportional to the sample y(n) of the digital output signal;
   a first of the switched capacitor DACs is arranged to be switched in to the continuous-time analog network for transfer of its charge to the continuous-time analog network in a time interval that lasts between the time instants $(n+\alpha 3)T$ and $(n+\beta 3)T$; and
   a second of the switched capacitor DACs is arranged to be switched in to the continuous-time analog network for transfer of its charge to the continuous-time analog network in a time interval that lasts between the time instants $(n+\alpha 4)T$ and $(n+\beta 4)T$;
   wherein, $\beta 4>1$, $0<\alpha 3<\alpha 4<\beta 4<2$ and $\alpha 3<\beta 3 \leq 1$.

3. The continuous-time ΔΣ-ADC of claim 2, wherein $\alpha 4 \leq \beta 3$.

4. The continuous-time ΔΣ-ADC of claim 2, wherein $\alpha 4=\beta 3$.

5. The continuous-time ΔΣ-ADC of claim 4, wherein $\alpha 4=\beta 3=1$, $\alpha 3=0.5$, and $\beta 4=1.5$.

6. The continuous-time ΔΣ-ADC of claim 1, wherein said one or more DACs comprises one or more additional DACs, in addition to the at least one DAC comprising the two switched capacitor DACs, wherein
   at least a first DAC of the one or more additional DACs is adapted to generate a pulsed feedback signal that, for each n, comprises a pulse, the magnitude of which is proportional to the sample of the digital output signal at sample instant nT and which lasts between the time instants $(n+\alpha 1)T$ and $(n+\beta 1)T$, wherein $0<\alpha 1<\beta 1<1$;
   wherein the first DAC is located in a first feedback loop and the DAC comprising the two switched-capacitor DACs is located in a second feedback loop, which is an outer feedback loop relative to the first feedback loop.

7. The continuous-time ΔΣ-ADC of claim 1, wherein the continuous-time analog network comprises a plurality of cascaded continuous-time integrators.

8. The continuous-time ΔΣ-ADC of claim 7, wherein
   a first one of the integrators is arranged to receive a feedback signal from one of the DACs, connected to the first integrator, and the analog input signal of the ΔΣ-ADC as input signals; and
   each of the other integrators is arranged to receive a feedback signal from one of the DACs, connected to that integrator, and the an output signal of a preceding integrator as input signals.

9. The continuous-time ΔΣ-ADC of claim 7, wherein a last one of the cascaded continuous-time integrators is arranged to generate the analog input signal to the sampled quantizer.

10. The continuous-time ΔΣ-ADC of claim 1, further comprising a memoryless feedback path from the output of the sampled quantizer to the input of the sampled quantizer.

11. A radio receiver circuit comprising the continuous-time ΔΣ-ADC of claim 1.

12. An integrated circuit comprising the continuous-time ΔΣ-ADC of claim 1.

13. A radio communication apparatus comprising the continuous-time ΔΣ-ADC of claim 1.

14. The radio communication apparatus of claim 13, wherein the radio communication apparatus is a mobile phone or a wireless data modem.

15. The radio communication apparatus of claim 13, wherein the radio communication apparatus is a radio base station.

* * * * *